(12) United States Patent  (10) Patent No.: US 8,866,626 B2
Kim  (45) Date of Patent: Oct. 21, 2014

(54) SYSTEM AND METHOD FOR DETECTING GENERATOR INCIPIENT FAILURES

(75) Inventor: Kiyong Kim, Collinsville, IL (US)

(73) Assignee: Basler Electric Company, Highland, IL (US)

( * ) Notice: Subject to any disclaimer, the term of this patent is extended or adjusted under 35 U.S.C. 154(b) by 534 days.

(21) Appl. No.: 13/290,910

(22) Filed: Nov. 7, 2011

(65) Prior Publication Data

US 2012/0050053 A1    Mar. 1, 2012

Related U.S. Application Data

(63) Continuation-in-part of application No. 12/183,781, filed on Jul. 31, 2008, now Pat. No. 8,275,488, which is a continuation-in-part of application No. 12/023,145, filed on Jan. 31, 2008, now abandoned.

(51) Int. Cl.
  *G08B 21/00* (2006.01)
  *G05D 17/00* (2006.01)
  *H02P 23/14* (2006.01)
  *H02P 9/10* (2006.01)

(52) U.S. Cl.
  CPC ........... *H02P 9/102* (2013.01); *H02P 23/14* (2013.01)
  USPC ............ 340/635; 700/292; 700/293; 700/294

(58) Field of Classification Search
  USPC ........................................................ 340/635
  See application file for complete search history.

(56) References Cited

U.S. PATENT DOCUMENTS

| | | |
|---|---|---|
| 4,563,734 A | 1/1986 | Mori et al. |
| 5,124,626 A | 6/1992 | Thoen |
| 5,294,879 A | 3/1994 | Freeman et al. |
| 5,691,896 A | 11/1997 | Zou et al. |
| 6,125,077 A | 9/2000 | Robinson et al. |
| 6,396,236 B1 | 5/2002 | Luukko |
| 6,549,858 B1 | 4/2003 | Shelley et al. |
| 6,577,908 B1 | 6/2003 | Wojsznis et al. |
| 6,697,767 B2 | 2/2004 | Wang et al. |
| 6,700,356 B1 | 3/2004 | Dorn |
| 6,760,716 B1 | 7/2004 | Ganesamoorthi et al. |
| 7,024,253 B2 | 4/2006 | Gaikwad et al. |
| 8,346,693 B2 * | 1/2013 | Al-Duwaish et al. ........... 706/21 |

(Continued)

OTHER PUBLICATIONS

A.M. El-Zonkoly, A.A. Khalil, N.M. Ahmied, "Optimal tunning of lead-lag and fuzzy logic power system stabilizers using particle swarm optimization," 2009, Elsevier, Expert Systems with Applications 36 (2009), pp. 2097-2106.*

(Continued)

*Primary Examiner* — Brent Swarthout
*Assistant Examiner* — John Mortell
(74) *Attorney, Agent, or Firm* — Polster Lieder Woodruff & Lucchesi, L.C.

(57) ABSTRACT

A method, system and computer software for detecting an incipient failure of a generator in a power system including the steps of ascertaining one or more generator reference parameter of the generator for use as a baseline reference; measuring one or more operating parameter values of the generator; using the one or more operating parameter values to solve for an estimated present value of the one or more of the generator's current performance parameters using particle swarm optimization technique; and determining whether the estimated present values of the one or more of the generator's current performance parameters are outside of an acceptable limit.

25 Claims, 8 Drawing Sheets

(56) References Cited

U.S. PATENT DOCUMENTS

| | | |
|---|---|---|
| 2003/0195641 A1 | 10/2003 | Wojsznis et al. |
| 2005/0137834 A1 | 6/2005 | Heydt et al. |
| 2005/0149209 A1 | 7/2005 | Wojsznis et al. |
| 2007/0208677 A1 | 9/2007 | Goldberg et al. |
| 2008/0036472 A1 | 2/2008 | Collins et al. |
| 2009/0198386 A1 | 8/2009 | Kim et al. |
| 2010/0026317 A1 | 2/2010 | Collins et al. |

OTHER PUBLICATIONS

Li Liu a,, Wenxin Liu b, David A. Cartes b, Il-Yop Chung b, "Slow coherency and Angle Modulated Particle Swarm Optimization based islanding of large-scale power systems," Aug. 21, 2008, Elsevier, Advanced Engineering Informatics 23 (2009), pp. 45-56.*

Binghui Yu, Xiaohui Yuan, Jinwen Wang, Apr. 2, 2007, "Short-term hydro-thermal scheduling using particle swarm optimization method," Apr. 2, 2007, Elsevier, Energy Conszervatoin and Management 48 (2007), pp. 1902-1908.*

K.K. Mandal , M. Basu, N. Chakraborty, "Particle swarm optimization technique based short-term hydrothermal scheduling," Oct. 22, 2007, Applied Soft Computing 8 (2008), pp. 1392-1399.*

International Search Report of the International Searching Authority, mailed Mar. 26, 2013.

Written Opinion of the International Searching Authority, mailed Mar. 26, 2013.

A.M. El-Zonkoly, Optimal tuning of power systems stabilizers and AVR gains using particle swarm optimization, Expert Systems with Applications, vol. 31, Issue 3, Oct. 2006, pp. 551-557.

Biró et al., On the Synchronous Machine Parameter Identification, Workshop on Electrical Machines' Parameters Technical University of Cluj-Napoca, May 26, 2001.

Eberhart et al. A New Optimizer Using Particle Swarm Theory, Sixth International Symposium on Micro Machine and Human Science Copyright 1995.

Flynn et al. A Self-Tuning Automatic Voltage Regulator Designed for an Industrial Environment. IEEE Transaction on EnergyConversion. Jun. 2, 1996, vol. 11, No. 2, pp. 429-434.

G. Sanchez, M. Villasana and M. Strefezza, Multi-objective pole placement with evolutionary algorithms. Lecture Notes in Computer Science, 4403 (2007), p. 417.

Gaing, Zwe-Lee. A Particle Swarm Optimization Approach for Optimum Design of PID Controller in AVR System. Transactions on Energy Conversion. Jun. 2, 2004, vol. 19, No. 2, pp. 384-391.

Kanniah et al.; "Self-Tuning Regulator Based on a Dual-Rate Sampling": IEEE Transactions on Automatic Control; D Aug. 1984; pp. 755-759; vol. AC 29, No. 8.

Kim et al, Application of Swarm Intelligence to a Digital Excitation Control System, 2008 IEEE Swarm Intelligence Symposium.

Kim et al.; "Turning a PID Controller for a Digital Excitation Control System" IEEE Transaction on Industry D Applications; Mar./Apr. 2005; pp. 485-492; vol. 41, No. 2.

Kyriakides, Elias, Innovative Concepts for on-Line Synchronous Generator Parameter Estimation, Arizona State University Dec. 2003.

Melgoza et al. Synchronous Machine Parameter Estimation Using the Hartley Series, IEEE Transactions on Energy Conversion, vol. 16, No. 1, Mar. 2001.

Perez, Joe a Guide to Digital Fault Recording Event Analysis, Reprinted with permission from 2010 GA Tech Fault & Disturbance Analysis Conference.

Power System Model Validation, Dec. 2010.

V. Mukherjee, S.P. Ghoshal, Intelligent particle swarm optimized fuzzy PID controller for AVR system, Electric Power Systems Research, vol. 77, Issue 12, Oct. 2007, pp. 1689-1698.

Verbeeck et al. Determination of Synchronous Machine Parameters Using Network Synthesis Techniques, IEEE Transactions on Energy Conversion, vol. 14, No. 3, Sep. 199.

Voda, et al. A Method for the Auto-calibration of PID Controllers. Automatica. 1995. vol. 31. No. 1, pp. 41-53.

Amaya et al., Identification of the Synchronous Machine Parameters by the Simulation of Time Domain Tests using Finite-Elements Method.

Suni et al.,On the Synchronous Generator Parameters Determination Using Dynamic Simulations Based on IEEE Standards.

* cited by examiner

GENERATOR PARAMETERS

APPLY   EXIT

MODEL TYPE: TWO-AXIS

SYNCHRONOUS REACTANCE
Xd: 1.81 p.u.    Xq: 1.76 p.u.

TRANSIENT REACTANCE
X'd: 0.3 p.u.    X'q: 0.65 p.u.

SUBTRANSIENT REACTANCE
X"d: 0.23 p.u.    X"q: 0.25 p.u.

TRANSIENT OC REACTANCE
T'do: 8 sec    T'qo: 1 sec

SUBTRANSIENT OC REACTANCE
T"do: 0.03 sec    T"qo: 0.07 sec

STATOR LEAKAGE INDUCTANCE
Xl: 0.15 p.u.

STATOR RESISTANCE
Ra: 0.003 p.u.

INERTIA CONSTANT
H: 3.5 p.u.

DAMPING COEFFICIENT
Kd: 0.01 p.u.

SATURATION CHARACTERISTICS
ASat: 0.031 p.u.    PSiT: 0.8 p.u.
BSat: 6.93 p.u.    PSiT2: 0 p.u.

SYSTEM AND METHOD FOR DETECTING GENERATOR INCIPIENT FAILURES

CROSS-REFERENCE TO RELATED APPLICATION

This application is a continuation-in-part of U.S. patent application Ser. No. 12/183,781, filed on Jul. 31, 2008, which is a continuation-in-part of U.S. patent application Ser. No. 12/023,145, filed on Jan. 31, 2008. Each of said applications are incorporated herein by reference in their entirety.

TECHNICAL FIELD

The present disclosure relates to alternating current power generators and, more specifically, to a system and method for management and maintenance of a power generator.

BACKGROUND

A serious problem in electric power generation in connection with the ever-increasingly-sized power grids of the electric utility systems is that of untimely and expensive generator outages in one of the generators within the power grid. An electrical power generator receives prime mover rotational force that rotates a coil of wire relative to a magnetic field or vice versa. In electrical generators, this magnetic field is generated using electromagnets known as field coils. An electrical current in these field coils provides the magnetic field necessary to induce an electrical current in the main generator coil to produce the generated power for delivery to the power grid.

Operators of reactive or voltage/ampere/reactive (VAR) generators must develop voltage and reactive planning and operating practices and procedures to ensure that they have sufficient reactive resources, voltages and reactive margins available for supplying AC energy to the power grid. As has been experienced in the past with power grids, an unplanned generator outage can have a negative effect to the entire power grid and can result in rolling blackouts. While standards have been developed by industry organizations such as the North American Electric Reliability Corporation (NERC) for voltage and reactive control and planning, such standards only provide for planning, design and operation of a generator within the power grid and do not address preventive maintenance or the forecasting of potential faults in the generator, such as turn-to-turn shorts in the field winding. As such, the inventor hereof has identified a need for a system and method that can detect incipient failures or faults of a generator to enable an operator to plan and implement maintenance on the generator to prevent unplanned generator outages.

SUMMARY OF THE INVENTION

The present invention provides a method, system and computer software for detecting an incipient failure of a generator in a power system including the steps of ascertaining one or more generator reference parameters of the generator for use as a baseline reference; measuring one or more operating parameter values of the generator; using the one or more operating parameter values to solve for an estimated present value of the one or more of the generator's current performance parameters using particle swarm optimization technique; and determining whether the estimated present values of the one or more of the generator's current performance parameters are outside of an acceptable limit.

DETAILED DESCRIPTION OF THE PREFERRED EMBODIMENT

The following description is merely exemplary in nature and is not intended to limit the present disclosure or the disclosure's applications or uses.

Figure 1:
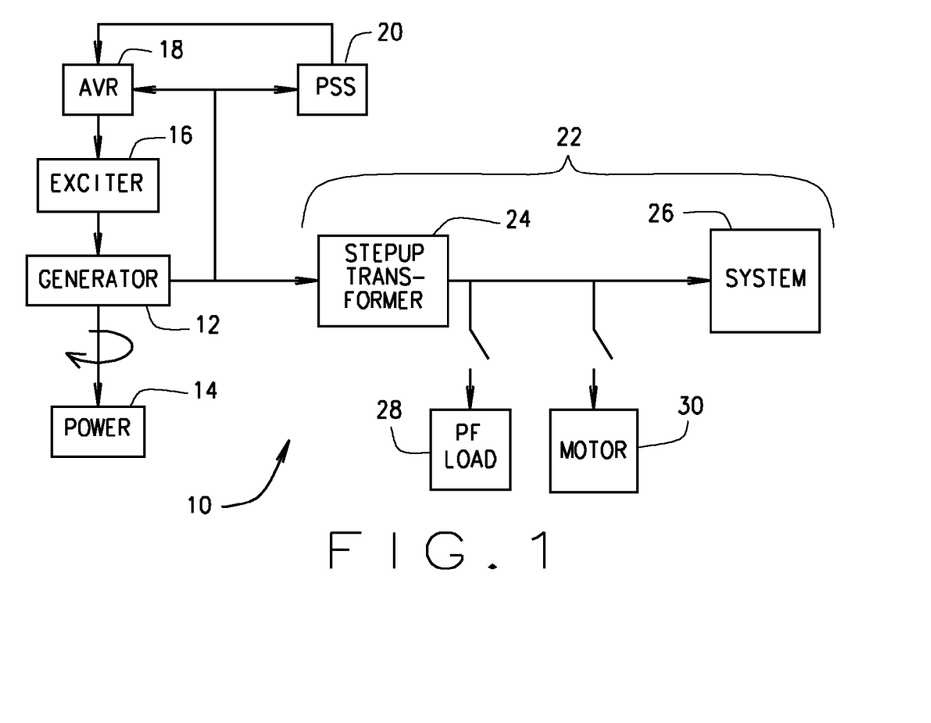
FIG. 1 is diagram of a system to estimate generator parameter values according to a one exemplary embodiment.

The present system and method are applicable to AC power generators within an AC power grid. A typical model for such an AC power generator and associated power system components is illustrated in FIG. 1. As shown, the generator 12 receives a rotational force input from a prime mover 14 that can be, for example, steam turbine driven, gas turbine driven, hydro driven, or diesel driven. The generator 12 receives a field voltage from an exciter 16 that powers field coils in the generator 12 at a variable level. The amount of field voltage provided by the exciter 16 to the generator 12 is determined by an automatic voltage regulator (AVR) 18. The AVR 18 determines the appropriate amount of field voltage to deliver to the generator 12 based on the operational needs of the power system. A power system stabilizer (PSS) 20 can interwork with the AVR 18 to stabilize the power generated by the generator 12. The AVR 18 and/or PSS 20 monitor a power grid 22 and the terminal voltages and currents at the outputs of the generator 12 to ensure that the generator 12 is operating as desired. The power grid 22 is modeled by representing transformers 24, transmission lines 26, as well as representing a power factor load 28 and large motor startup loads 30.

Figure 2:
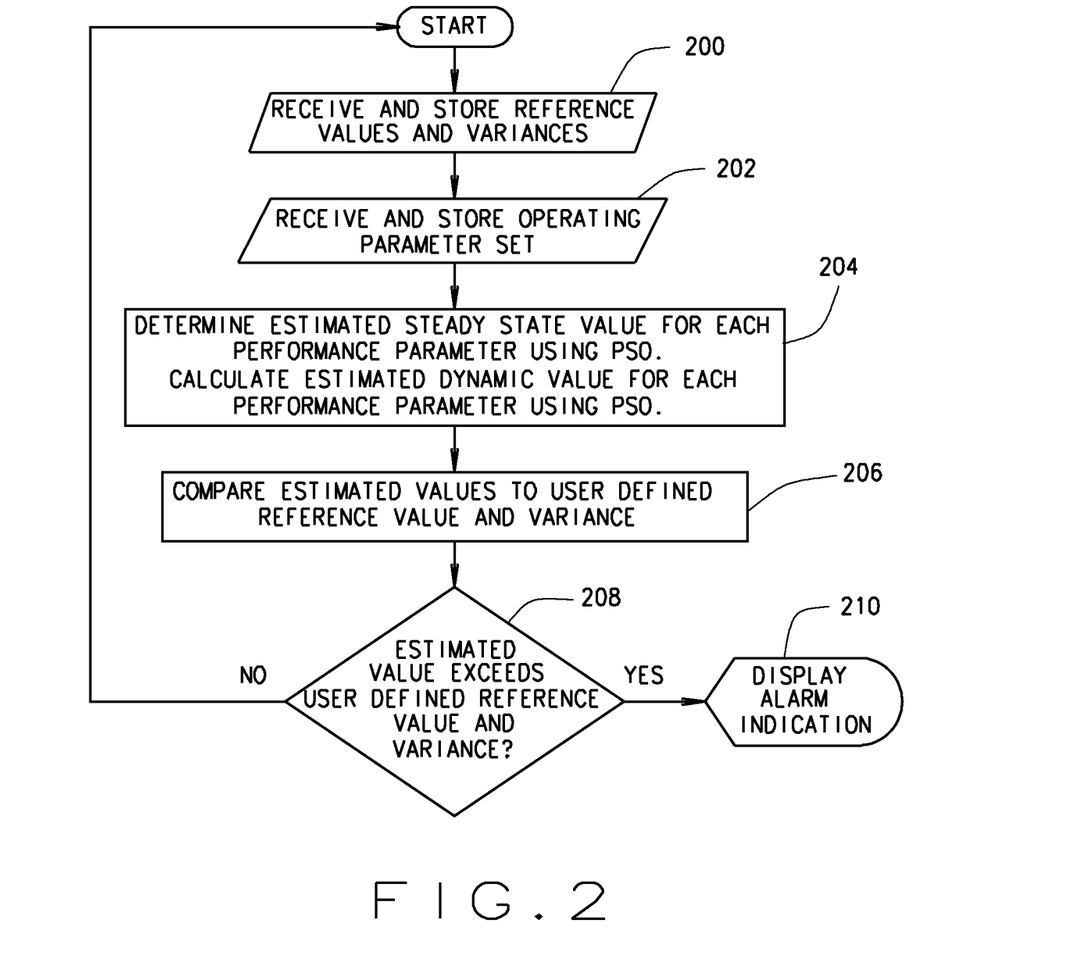
FIG. 2 is a flow chart of a system to estimate generator parameter values according to an exemplary embodiment.

As shown in FIG. 2, the following describes one exemplary embodiment of a generator incipient failure detection method. The steps of FIG. 2 are described below and with reference to the other Figures. In the description of the various flowcharts, the functional explanation of a step is marked with numerals in angle brackets <nnn>, Step 1: Receiving and Storing Generator Reference Parameter Inputs <200>:

The first step <200> of the exemplary process is receiving and storing generator reference parameter values. The generator reference parameter values are either as calculated or measured by the manufacturer at the time of manufacture of the generator or as otherwise determined or measured.

These reference parameter values provide a baseline input and reference for assessing the performance of the generator and include design parameters and performance parameters and are referred herein as generator design reference parameters. Some parameters are fixed for the life of the generator, such as the number of windings and poles, or can vary during operation of the generator due to speed, temperature or field voltage of operation of the generator or other factors such as for example the resistance of the armature winding $R_a$, which varies with temperature. Other manufacturer parameters cannot be directly measured in real time during operation of the generator.

Examples of generator reference parameters for which values can be measured or calculated for a specific generator are:
$R_a$=armature winding resistance.
$R_{fd}$=field winding resistance
$X_l$=leakage reactance
$X_d$=synchronous steady state direct reactance
$X_q$=synchronous steady state quadrature reactance
$X'_d$=synchronous dynamic direct reactance
$X'_q$=synchronous dynamic quadrature reactance
$T'_{do}$=generator open circuit direct time constant
$T'_{qo}$=generator open circuit quadrature time constant The step of receiving and storing generator reference parameter inputs can include a user interface such as a graphical user interface (GUI) to enter such values and variances into the system.

Step 2: Measurement of Operating Parameter Values:

The next step <202> is the measurement of operating parameter values during operation of the generator. The operating parameter values comprise directly measureable steady state and dynamic state generator performance or reference values that include, but are not limited to, one or more of the per-phase terminal voltages, the per-phase terminal currents, the total power P, and the internal rotor angle. As known in the art, these measurements can be sampled and recorded over time.

In one embodiment, the sampled operating parameters in an operating parameter set can include one or more of:
$E_{fd}$=field voltage
$I_{fd}$=field current
$E_t$=terminal voltage
$I_t$=terminal current
$\phi$=the load angle
$\delta_i$=the power angle (internal rotor angle)
$V_{gen}$=generator voltage
$V_r$=reference voltage
P=Real power of the generator
Q=Reactive power of the generator If a power angle $\delta_i$ cannot be measured such as where a power angle measurement device is not available, the power angle $\delta_i$ can be calculated as noted below.

These operating parameter values are provided during system tests or on a periodical operating basis for determining the generator's operating parameter values. Furthermore, the system and method as described herein can be continuous during operation of the generator in a monitoring mode for real time measurement of the operating parameters.

Step 3: Estimation of Generator Performance Parameters:

While measureable performance values are received above, other aspects of a generator's performance parameters are not directly measureable while the generator is in operation, but if known would provide insight into the probability of incipient failure of that generator. To estimate the values of the performance parameters, the present disclosure provides for application of one or more generator models. The system utilizes a user selected generator model and estimates those parameter values within the selected generator model using a parameter estimation system and method described below. The parameter estimation system includes a user interface such as a graphical user interface (GUI) to provide a user with the ability to initialize the system and to control an on-line real time parameter estimation process for a given generator. The parameter estimation system and method as will be described herein utilizes the measured sampled operating parameter values of the field and stator voltages and currents for both the steady state and dynamic modes of operation for estimating generator performance parameters. One exemplary set of the performance parameters that can be estimated is as follows:
$X_d$=synchronous steady state direct reactance
$X_q$=synchronous steady state quadrature reactance
$X'_d$=synchronous dynamic direct reactance
$X'_q$=synchronous dynamic quadrature reactance
$T'_{do}$=generator open circuit direct time constant
$T'_{qo}$=generator open circuit quadrature time constant As used herein, the single apostrophe indicates the dynamic parameter as compared to the steady state parameter.

This exemplary set of estimated performance parameters will hereinafter be referred to as the estimated performance parameters. As will be described, each of these will have their values estimated and those values will be compared to a reference parameter value and variance from Step 1 above.

It should be understood to those of skill in the art that the identified set of estimated performance parameters is only one exemplary set and fewer or additional generator parameters can be included within the present system and method and still be within the scope of the present disclosure.

The PSO Estimation Strategy

The generator incipient failure detection system and method utilizes particle swarm optimization (PSO) to estimate the values of the generator performance parameters in real time based on the actual measured operating parameter values and certain reference parameter values. While the PSO derived estimated parameter values are based on real time measurements, the PSO method estimates parameter values to determine when the value is outside of acceptable parameters.

For the power generation systems, available data for synchronous generators are the stator phase currents and voltages at the terminals of the machine, and the field voltage and current. Thus, these parameters are used to formulate the parameter estimation problem.

The generator field voltage, three phase generator terminal voltages and currents are continuously monitored. If the generator is operating at the steady state, the generator synchronous reactances ($X_d$ and $X_q$) are estimated based on the steady state condition.

Figure 3:
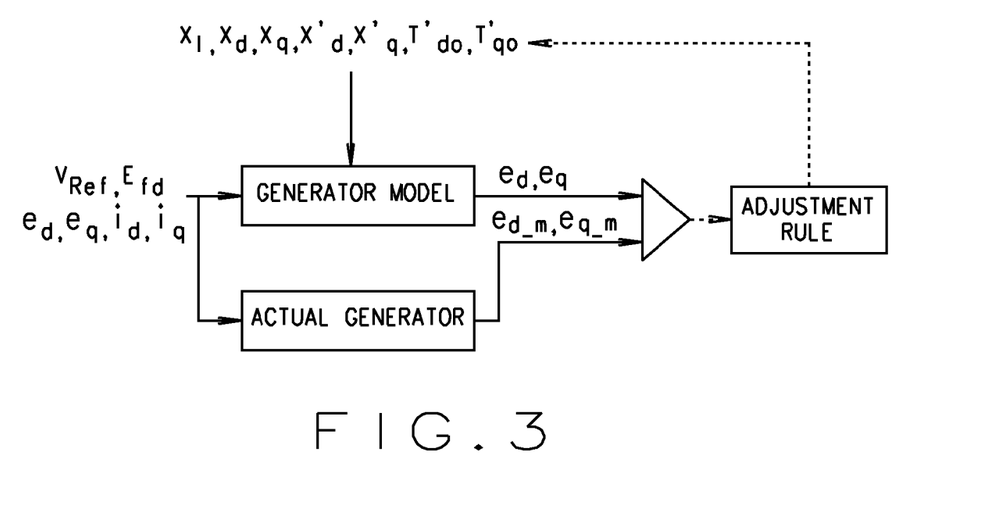
FIG. 3 is a diagram of a system to estimate generator parameter values according to an exemplary embodiment.

When an event to cause a considerable change in the generator field voltage is detected, its dynamic responses are recorded for five seconds. The recorded responses are utilized to estimate the generator dynamic parameters ($X'_d$, $X'_q$, $T'_{do}$, $T'_{qo}$) as shown in FIG. 3.

The recorded field voltages and generator terminal currents are applied to the time domain simulation to calculate the generator voltages. For the generator model for simulation, the derivative of d-axis and q-axis flux linkages are ignored. Thus, two-axis generator model represented in equations below is used which includes the fundamental features of voltage responses, but assumes that all stator/network transients have been eliminated. This assumption is correct since the rate of change of the terminal voltage and current of the machine is negligible under small disturbance conditions.

$$T'_{qo} \frac{E'_d(t)}{dt} = -E'_d(t) + i_q(t)(X_q - X'_q) \tag{1}$$

$$T'_{do} \frac{E'_q(t)}{dt} = -E'_q(t) - i_d(t)(X_d - X'_d) + E_{fd}(t) \tag{2}$$

$$e_d(k) = E'_d(k) - R_a i_d(k) + X_q i_q(k) \tag{3}$$

$$e_q(k) = E'_q(k) - R_a i_q(k) - X_d i_d(k) \tag{4}$$

The simulation results obtained using this generator model are compared with the recorded data. If the results do not match, the generator parameters are adjusted by the PSO technique to provide the best match. The technique is inspired by the social behavior of bird flocking or fish schooling. In PSO, the potential particles (solutions) fly through the problem space by following the current optimum particles. Each particle keeps track of its coordinates in the problem space and communicates the best solution found to the other particles. This communication allows an intelligent decision on a next attempt to find the best possible solution (a set of generator parameters).

PSO is initialized with a group of five particles and then searches through the problem space for optima by following the optimum particles found so far. The problem solution space is defined as the generator parameters ($X_d$, $X_q$, $X'_q$, $T_{do}$, $T'_{qo}$). With present particle and the recorded generator field voltage, the model's response ($y_k$) is calculated for k=1, ..., N. The calculated response is compared with the actual system response. Let a sampled value of the actual system response at the k-stage be $z_k$. The fitness function to choose the best particle is the sum of the square of the differences between $z_k$ and $y_k$, k=1, ..., N as follows:

$$J = \sum_{k=1}^{N} (z_k - y_k)^2 \tag{5}$$

After finding the two best values, the particle updates its velocity and positions with the following equations:

$$v_{k+1} = \alpha v_k + \beta_1 \mathrm{rand}_1(x_k^{self} - x_k) + \beta_2 \mathrm{rand}_2(x_k^{global} - x_k) \tag{6}$$

$$x_{k+1} = x_k + v_k \tag{7}$$

Where $v_k$ is the particle velocity, $x_k$ is the current particle (solution), $x_k^{self}$ and $x_k^{global}$ are defined as best value for a particle and best value among all particles. $\alpha$ is an inertia weight. $\mathrm{rand}_1$ and $\mathrm{rand}_2$ are random numbers between 0 and 1. $\beta_1$ and $\beta_2$ are learning factors. In this paper, the PSO technique described above is modified to achieve a better search for the present problem, as described below.

Estimation of Generator Parameters

Figure 9:
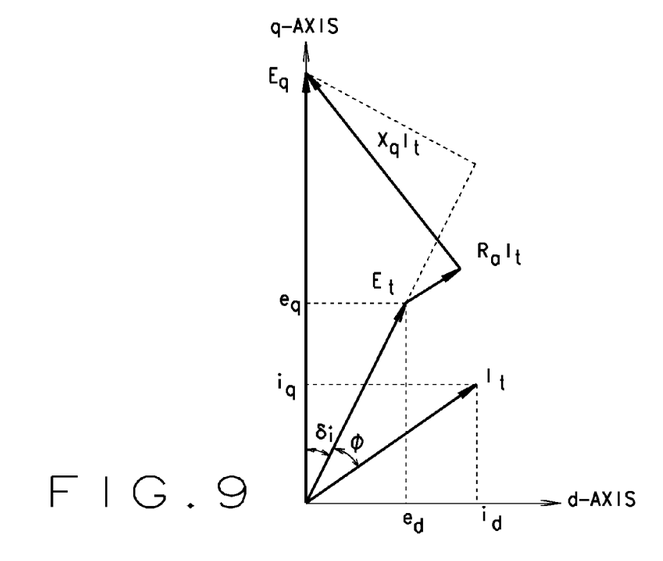
FIG. 9 is a phasor diagram of a generator according to an exemplary embodiment.

The machine model in the previous section is the d- and q-axis standard model with one damper winding on the each axis. Thus, the d- and q-axis generator voltages and currents are calculated by the equations below using sampled three phase generator terminal voltages and currents.

$$e_d = E_t \sin\delta_i \tag{7}$$

$$e_q = E_t \cos\delta_i \tag{8}$$

$$i_d = \frac{P\sin\delta_i + Q\cos\delta_i}{E_t} \tag{9}$$

$$i_q = \frac{P\cos\delta_i - Q\sin\delta_i}{E_t} \tag{10}$$

where $\delta_i$, $E_t$, $I_t$, P, and Q are generator internal rotor angle (power angle), terminal voltage, current, active power, and reactive power, respectively. See FIG. 9.

The measurements needed for the estimation process are three phase ac voltages and currents, field voltage, and rotor angle. The power angle is assumed to be obtained from a power angle measurement device, though an estimated value could also be calculated, as described below.

Power Angle, $\delta_i$

The steady state value of power angle, $\delta_i$, is calculated using the following relation:

$$\hat{\delta}_i = \tan^{-1}\left(\frac{X_q I_t \cos\phi - R_a I_t \sin\phi}{E_t + R_a I_t \cos\phi + X_q I_t \sin\phi}\right) \tag{11}$$

Using the known values of $E_t$, $I_t$, and $\phi$ and the manufacturer supplied values of $R_a$, $X_q$, the power angle is computed and compared against the measured steady state value. A consistent offset reported between calculated and measured value of $\delta_i$ is compensated by calibrating it to zero with zero measured active power.

Steady State Parameters ($X_d$ and $X_q$)

At the steady-state operating condition, the generator synchronous reactances ($X_d$ and $X_q$) are estimated based upon the following equations:

$$\hat{X}_q = \frac{e_d}{i_q} \tag{12}$$

$$\hat{X}_d = \frac{E_{fd}\hat{K}_{sd} - e_q}{i_d} \tag{13}$$

where $K_{sd}$ is the generator saturation coefficient at steady state condition.

Saturation Coefficient, $K_{sd}$

The parameters of a synchronous machine vary under different loading conditions because of changes of the machine internal temperature, magnetic saturation, aging, and coupling between the machine and external systems.

Several assumptions are made to represent saturation in transient stability studies since a rigorous treatment of synchronous machine performance including saturation is a futile exercise. A practical method for dealing with saturation effects based on semi-heuristic reasoning, and carefully chosen approximations is given in [9].

The effect of saturation is characterized by the saturation functions. This variation causes the change in the field voltage. In order to handle the saturation effects based on simplicity of estimation method, the field voltage is multiplied by the saturation coefficient.

Based on the three base terminal voltages and currents, $P_t$ and $Q_t$ are calculated, and we can find $$I_t = \frac{\sqrt{P_t^2 + Q_t^2}}{E_t} \tag{14}$$

$$\Psi_t = |E_t + (R_a + jX_l)I_t| \tag{15}$$

$$\hat{K}_{sd} = \frac{\Psi_t}{\Psi_t + A_{sat}e^{B_{sat}(\Psi_t - \Psi_{t1})}} \tag{16}$$

where $R_a$ and $X_l$, are generator stator resistance and leakage reactance, respectively. $A_{sat}$, $B_{sat}$, and $\Psi_{tl}$ are generator saturation coefficients.

Dynamic State Parameters ($X'_d$, $X'_q$, $T'_{do}$, $T'_{qo}$)

The dynamic parameters are identified using the PSO technique by comparing the actual measured voltages with the calculated generator voltages. A time domain simulation is performed to calculate the generator voltages when the recorded generator field voltages are applied.

The generator parameters for the simulation model are adjusted by the PSO technique to provide the best match. The set of generator parameters are expressed as a particle position, ($\hat{T}'_{do}$, $\hat{X}_d$, $\hat{X}'_d$, $\hat{T}'_{qo}$, $\hat{X}_q$, $\hat{X}'_q$). The generator model with each particle position is used to calculate the terminal voltages. For simulation of the generator response to the applied field voltage with measured generator currents, the Euler integration method is utilized for solving ordinary differential equations of dynamic models. The Euler method is utilized just for simplicity since the propagation error is negligible with an integration step size of 1 msec.

$$E'_d(k+1) = E'_d(k) + \frac{\Delta t}{\hat{T}'_{qo}}\left(-E'_d(k) + i_q(k)(\hat{X}_q - \hat{X}'_q)\right) \quad (17)$$

$$E'_q(k+1) = E'_q(k) + \frac{\Delta t}{\hat{T}'_{do}}\left(-E'_q(k) - i_d(k)(\hat{X}_d - \hat{X}'_d) + \hat{K}_{sd}E_{fd}(k)\right) \quad (18)$$

$$e_d(k) = E'_d(k) - \hat{R}_a i_d(k) + \hat{X}_q i_q(k) \quad (19)$$

$$e_q(k) = E'_q(k) - \hat{R}_a i_q(k) - \hat{X}_d i_d(k) \quad (20)$$

where $\Delta t$ is the integration step size and $K_{sd}$ is the generator saturation coefficient calculated at a pre-triggered condition. The given manufacturer or measured value is used for the stator resistance $R_a$. The stator resistance change to a specified operating temperature may also be calculated in accordance with the prior art.

The initial values for the dynamic equations, $E'_d(0)$ and $E'_q(0)$, are calculated based on the sampled values at pre-triggered conditions using the following equations:

$$E'_d(0) = \frac{1}{N}\sum_{k=1}^{N} e_d(k) + R_a i_d(k) - \hat{X}_q i_q(k) \quad (21)$$

$$E'_q(0) = \frac{1}{N}\sum_{k=1}^{N} e_q(k) + R_a i_q(k) + \hat{X}_d i_d(k) \quad (22)$$

The simulated generator d- and q-axis values are compared with the measured values, $e_{d\_m}(k)$ and $e_{q\_m}(k)$, using the fitness function $$J = \sum_{k=1}^{N} [(e_{d\_m}(k) - e_d(k))^2 + (e_{q\_m}(k) - e_q(k))^2] \quad (23)$$

After finding the two best values (global best and self best), the particle updates its velocity and positions with the following equations:

$$v_{k+1} = \alpha v_k + \beta_1 \text{rand}_1(x_k^{self} - x_k) + \beta_2 \text{rand}_2(x_k^{global} - x_k) \quad (24)$$

$$x_{k+1} = x_k + v_k \quad (25)$$

where $v_k$ is the particle velocity, $x_k$ is the current particle (solution), $X_k^{self}$ and $x_k^{global}$ are defined as best value for a particle and best value among all particles. The inertia weight, a, is 0.9 and the learning factors, $\beta_1$ and $\beta_2$, are 0.1. No random number is multiplied in the function above where the simulated generator d- and q-axis values are compared with the measured values using the fitness function. Instead, a new set of particles are generated after 50 iterations as follows:

$$\hat{X} = \text{rand}(\ ) \cdot X_{nominal} \quad (26)$$

The boundary of the search surface for each particle is clamped with the following rules:

$$0.2 \cdot X_{nominal} \leq X_E \leq 1.2 \cdot X_{nominal} \quad (27)$$

Figure 4:
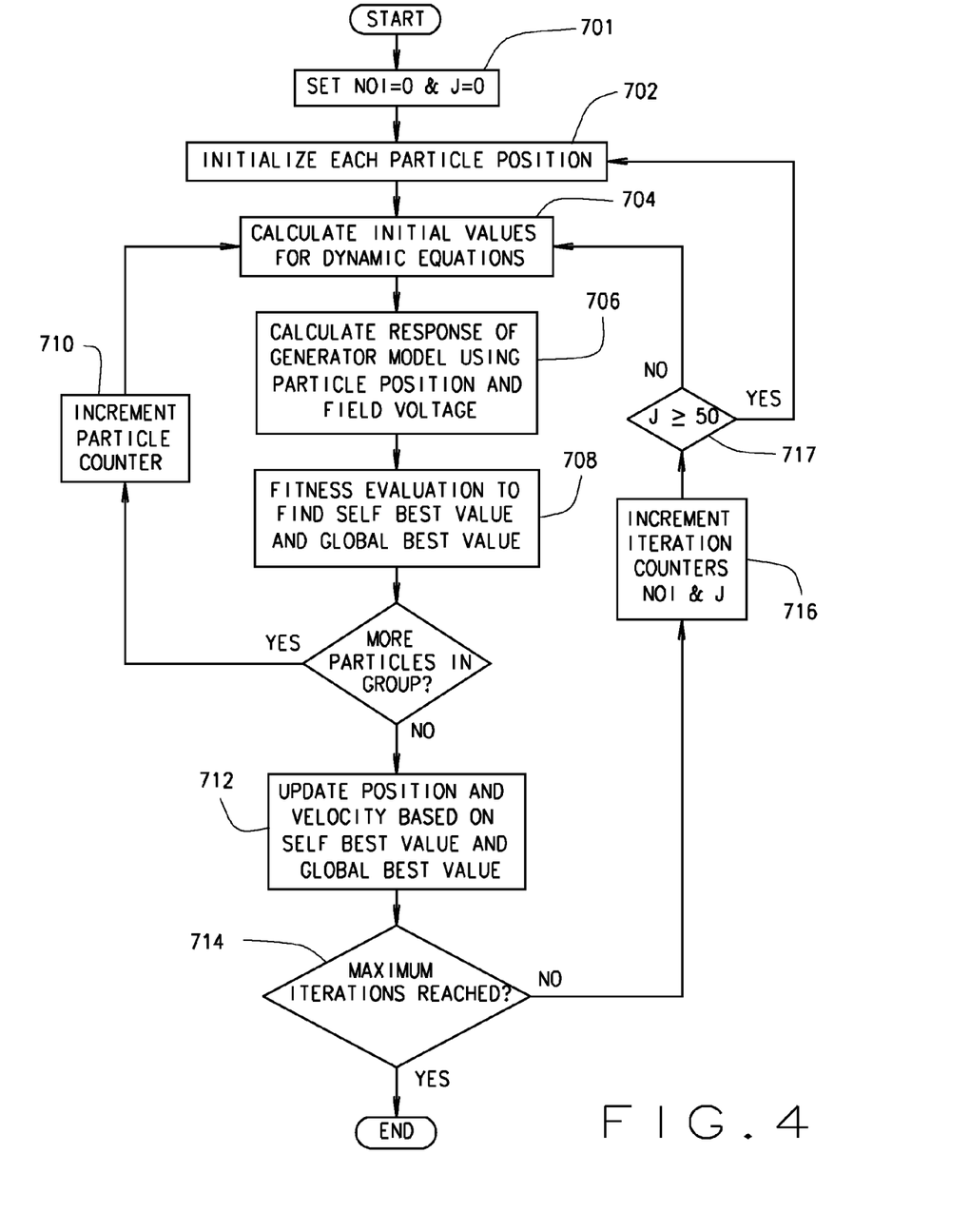
FIG. 4 is a flow chart of a system to estimate generator parameter values according to an exemplary embodiment.

Referring to FIG. 4, the computational procedure of the proposed PSO technique is summarized as follows:

Step 0<701>: Initialize iteration indices, NOI=0, J=0

Step 1<702>: Initialize each particle position using the equation (26).

Step 2<704>: Calculate initial values for the dynamic equations, $E'_d(0)$ and $E'_q(0)$, for the simulation models using the equations (21) and (22)

Step 3<706>: Calculate model's response with a selected particle position, $e_d(k)$ and $e_q(k)$, k=1, ..., N, by applying the measured field voltages to the equations (17)-(20).

Step 4<708>: Calculate the fitness function, equation (23), to check the best particle based on the model's responses obtained in step 3 and the recorded responses. If it is better, update the best particle.

Step 5<710>: Until all particles are calculated in step <710>, increment a particle counter <711> and repeat steps <704>, <706> and <708> for each particle.

Step 6<712>: Update new particle position and velocity using equations (24) and (26).

Step 7<714>: Next in decision block <714>, determine whether the maximum number of iterations has been reached. If the maximum number of iterations has not been reached in step <716>, increment an iteration counters (NOI and J) and go to step <717>. If reached, further estimation of the parameter value is stopped.

Step 8<717> If the index J is 50, go to step <702>. If not, go to step <704>.

At the end of the iterative process, the global best value will contain the closest estimation of the parameter value.

Step 4<206>: Compare Estimated Values to Received and Stored Reference Values and Variances Referring back to FIG. 2, after estimation of steady state or dynamic state generator performance parameters, the estimated parameter are compared to the received and stored reference values and variances from step 1<200>.

Step 5<208>: Determine Whether To Set An Alarm

If in step 4<206> it is determined that a steady or dynamic state performance parameter is beyond an expected value by a certain amount or beyond a provided variance from the expected value, an alarm is displayed (step <210>) to an operator that a generator performance value is outside of the expected value or range. If all parameters are within the expected range the generator parameter comparison and estimation process is immediately retriggered or retriggered at a later time based upon predefined conditions.

Implementation of the Process in a Computing Environment

The present invention can be implemented in conjunction with an actual generator or in a real time simulation program for simulating a power generation system in order to test the present system's ability to successfully estimate generation parameters. Most preferably, the present invention is implemented in a MICROSOFT WINDOWS-based application program operating on a computer system capable of operating the WINDOWS environment with the present invention having its own graphic user interface (GUI).

Figure 5:
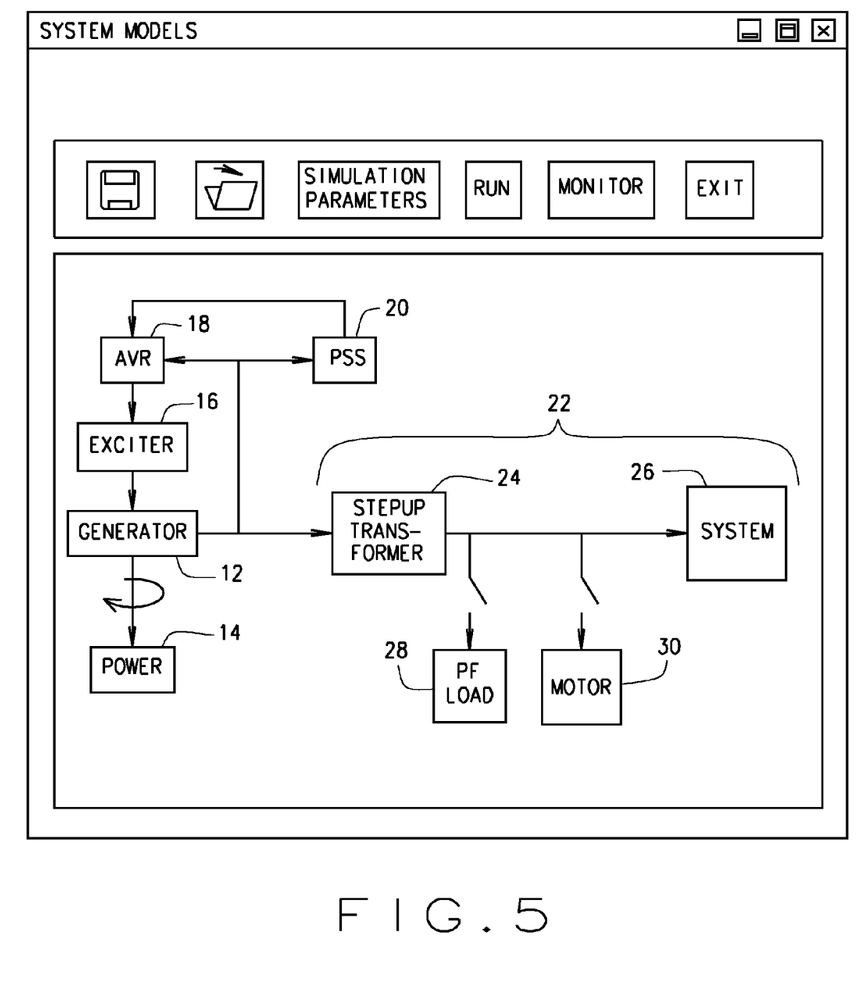
FIGS. 5-8 are screen shots of a system to estimate generator parameter values according to an exemplary embodiment.

For testing, a real time simulation program for simulating a rudimentary power generation system connected to a large power system with balanced conditions is provided and is depicted within the application (FIG. 5). As seen in FIG. 5, the power system model of FIG. 1 is displayed within the interface and the elements of the model maybe selected to define the characteristics of the element within the model through the user interface (for example, the generator parameter window of FIG. 6).

The measurement process of the machine responses is extracted from the real time simulation program. By measuring the quantities of generator voltage, current, power, and rotor internal angle the d- and q-axis terminal voltages and currents, $e_d$, $e_q$, $i_d$, and $i_q$ can be obtained using equations (7)-(10). The noise and bias error are added to the measured quantities to check estimation performance of the proposed method.

Figure 6:
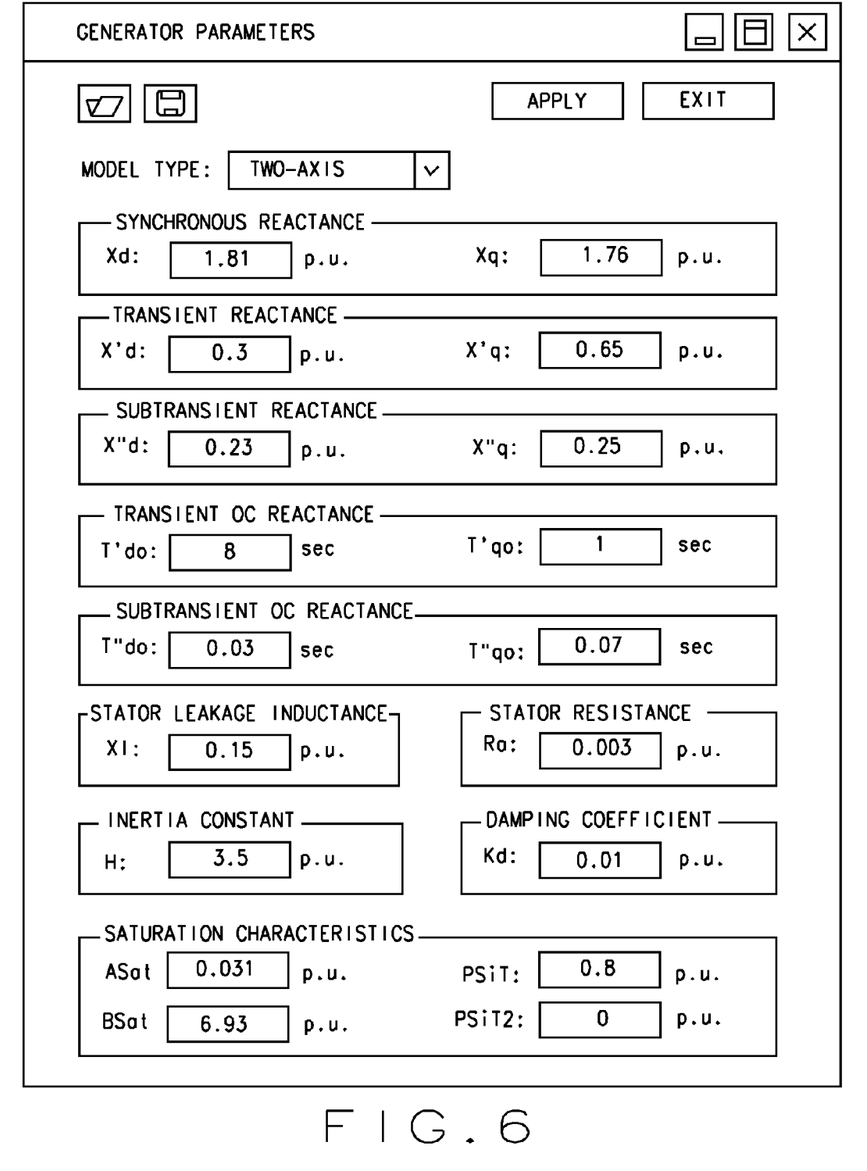

While the simulation is running, the system model parameters are allowed to change in real time, either automatically through a random script or a step-wise script or through user inputs that manually change one of measured quantities or characteristics of the system through an interface such as that of FIG. 6 (showing for changing generator parameters). Similarly, the interface of FIG. 5 may be used to change other system elements, for example, to model a power factor load change within the system. In an example, a generator model with two damper windings is implemented in the realtime simulation program through the interface of FIG. 6. The generator parameter dialog window of FIG. 6 will then appear by clicking the generator block from FIG. 5. The GUI application is also designed to control breaker status open/close by clicking the mouse in the appropriate position in FIG. 5. Thus, the AVR performance is evaluated for various generators and system configurations like load application/rejection, motor starting problems, and other power system occurrences.

Figure 7:
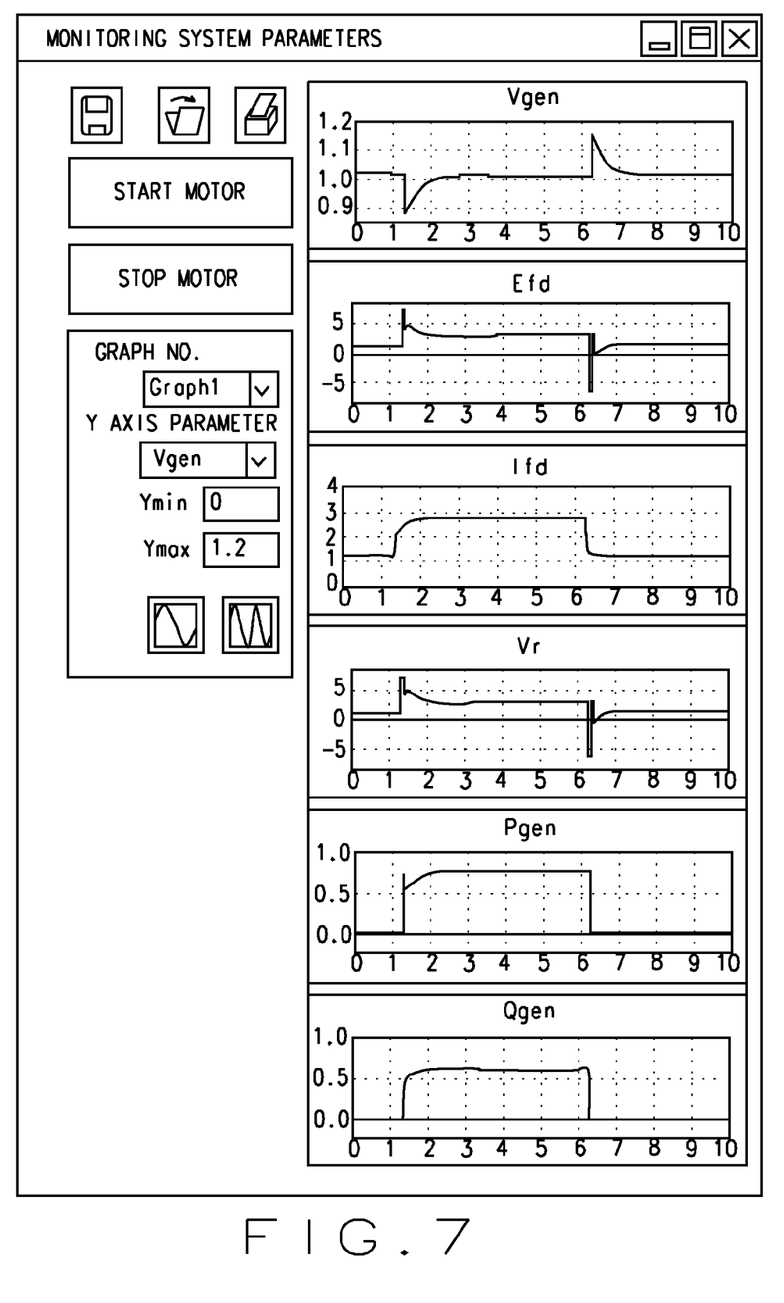

In a preferred embodiment, a monitoring screen has been designed for six system states, $V_{gen}$, $E_{fd}$, $I_{fd}$, $V_r$, $P_{gen}$ and $Q_{gen}$. As shown in FIG. 7, six system states are selected to monitor system responses and can be stopped for analysis for pressing start monitor and stop monitor command buttons within FIG. 7. Graphs showing the parameters over time are displayed and characteristics of the graph can be controlled by selecting the graph number, determining the parameter that will be shown in that graph number, selecting the minimum and maximum units for the Y-axis, and manipulating the scale for the time scale, all within the display of FIG. 7. Thus, system responses due to a disturbance can be easily analyzed. FIG. 7 shows the monitoring screen with the example of a load application and rejection when the generator breaker and load breakers are closed and opened.

Figure 8:
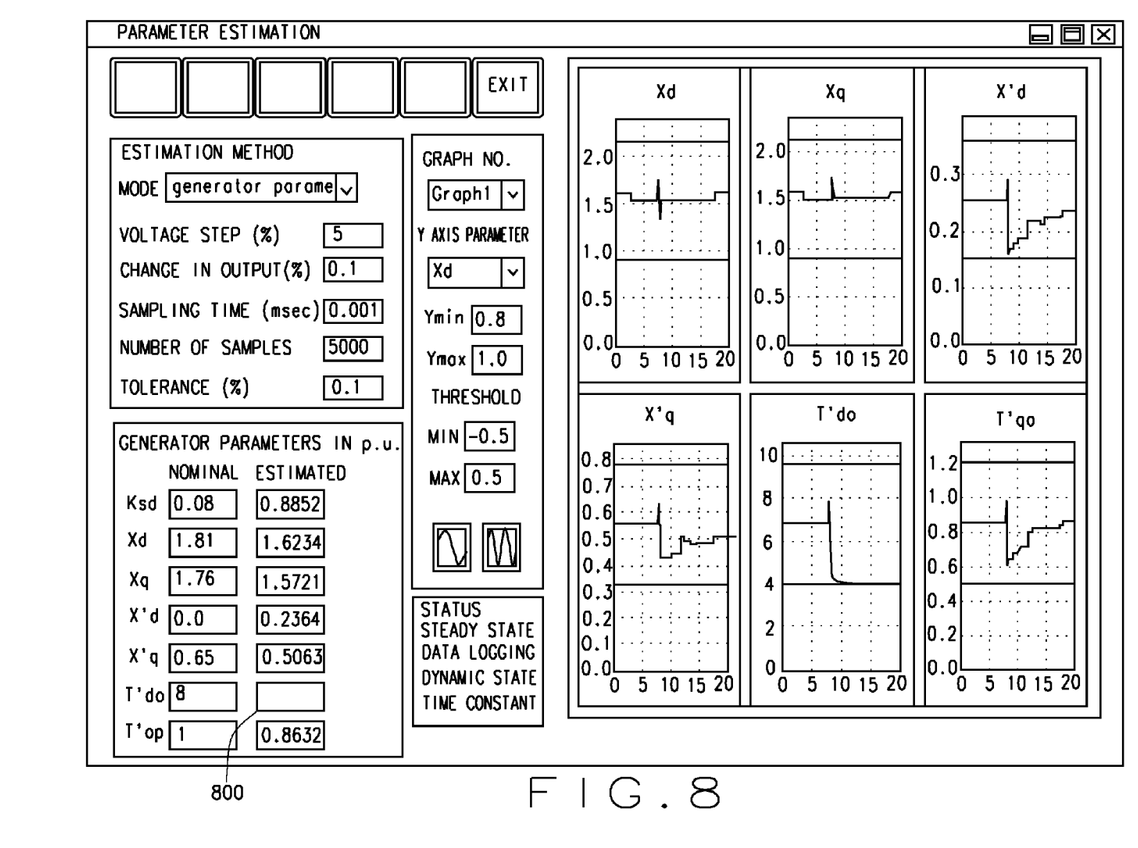

When a trigger mode is selected, the generator field voltage is continuously monitored for any significant change for estimation of the generator parameters. On-line estimation is disabled if the generator power is less than 10%. For a normal operation without any considerable change in the system operation, the steady state parameters ($X_d$ and $X_q$) are estimated. In the preferred embodiment, if a sudden change in the field voltage is detected, the program collects generator dynamic responses, field voltage, rotor position, voltages and currents for 5 seconds. The pre-triggered values are also collected for calculating the initial conditions for the estimation. These sampled values are used to estimate the generator parameters. If any significant change in the generator parameters is detected, its results are announced to the operator. FIG. 8 shows typical real-time estimation profiles when a system disturbance is detected.

The parameter estimation steps are implemented into the program of the present embodiment as shown in FIG. 8. The interface of FIG. 8 shows on-line parameter estimation for a given synchronous machine based on measurements of the field and stator voltages and currents. It has been designed to select estimation modes and monitor the estimate values of six generator parameters in the real-time. Three modes can be selected from this screen, step response mode, event trigger mode, and test mode to test the identification of generator parameters in response to simulated system occurrences. The step response mode is used for estimating the generator parameters by a forced step change in the generator voltage setpoint. If the generator breaker is opened, the generator open circuit time constant ($T'_{do}$) is estimated. If it is connected to the system, six parameters, ($X_d$, $X_q$, $X'_d$, $X'_q$, $T'_{do}$, $T'_{qo}$), are estimated using the proposed method. The test mode is selected if more estimation iterations are required. That is, parameter estimation is performed based on the previous recorded values.

In addition to graphic the estimated parameter values over time, the interface of FIG. 8 (like the interface of FIG. 7) allows a user to alter the x-scale and y-scale of the parameter graphs, displays current simulation status, allows manipulation of the estimation method settings, such as voltage step (%), change in output (%), sampling time (seconds) number of samples taken, and tolerance (%). Additionally, present time parameter estimated values are displayed adjacent the recorded (nominal) generator parameter values and visual indicators of parameters that are beyond acceptable limits are provided. The estimated parameters are continuously displayed and compared with the given generator parameters for detecting incipient failures. If a parameter is out of the allowable bound, the value is displayed in a red color in the estimation parameter screen as shown in FIG. 8 at 800.

Computer Operating Environment

Figure 10:
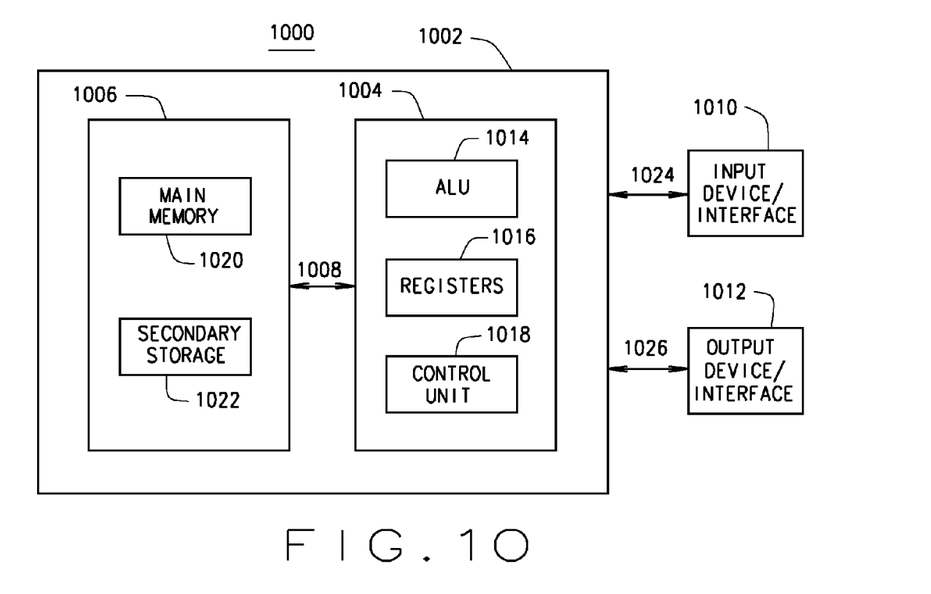
FIG. 10 is a diagram of a system to estimate generator parameter values according to an exemplary embodiment.

Referring to FIG. 10, an operating environment for an illustrated embodiment of a system and/or method for detecting an incipient failure in a generator as described herein is a computer system 1000 with a computer 1002 that comprises at least one high speed central processing unit (CPU) 1004, in conjunction with a memory system 1006 interconnected with at least one bus structure 1008, an input device 1010, and an output device 1012. These elements are interconnected by at least one bus structure 1008.

As addressed above, the input and output devices can include a communication interface including a graphical user interface. Any or all of the computer components of the network interface and communications systems and methods can be any computing device including, but not limited to, a lap top, PDA, Cell/mobile phone, as well as potentially a dedicated device. The software can be implemented as any "app" thereon and still be within the scope of this disclosure.

The illustrated CPU 1004 for a system for detecting an incipient failure of a generator is of familiar design and includes an arithmetic logic unit (ALU) 1014 for performing computations, a collection of registers 1016 for temporary storage of data and instructions, and a control unit 1018 for controlling operation of the computer system 1000. Any of a variety of processors, including at least those from Digital Equipment, Sun, MIPS, Motorola, NEC, Intel, Cyrix, AMD, HP, and Nexgen, is equally preferred but not limited thereto, for the CPU 1004. This illustrated embodiment operates on an operating system designed to be portable to any of these processing platforms.

The memory system 1006 generally includes high-speed main memory 1020 in the form of a medium such as random access memory (RAM) and read only memory (ROM) semiconductor devices that are typical on a non-transient computer recordable medium. The present disclosure is not limited thereto and can also include secondary storage 1022 in the form of long term storage mediums such as floppy disks, hard disks, tape, CD-ROM, flash memory, etc., and other devices that store data using electrical, magnetic, and optical or other recording media. The main memory 1020 also can include, in some embodiments, a video display memory for displaying images through a display device (not shown). Those skilled in the art will recognize that the memory system 1006 can comprise a variety of alternative components having a variety of storage capacities.

Where applicable, an input device 1010, and output device 1012 can also be provided in the system as described herein or embodiments thereof. The input device 1010 can comprise any keyboard, mouse, physical transducer (e.g. a microphone), and can be interconnected to the computer 1002 via an input interface 1024, such as a graphical user interface, associated with or separate from the above described communication interface including the antenna interface for wireless communications. The output device 1012 can include a display, a printer, a transducer (e.g. a speaker), etc, and be interconnected to the computer 1002 via an output interface 1026 that can include the above described communication interface including the antenna interface. Some devices, such as a network adapter or a modem, can be used as input and/or output devices.

As is familiar to those skilled in the art, the computer system 1000 further includes an operating system and at least one application program. The operating system is the set of software which controls the computer system's operation and the allocation of resources. The application program is the set of software that performs a task desired by the method of detecting an incipient error in a generator and or any of the above described processes and process steps using computer resources made available through the operating system.

In accordance with the practices of persons skilled in the art of computer programming, the present disclosure is described below with reference to symbolic representations of operations that are performed by the computer system 1000. Such operations are sometimes referred to as being computer-executed. It will be appreciated that the operations which are symbolically represented include the manipulation by the CPU 1004 of electrical signals representing data bits and the maintenance of data bits at memory locations in the memory system 1006, as well as other processing of signals. The memory locations where data bits are maintained are physical locations that have particular electrical, magnetic, or optical properties corresponding to the data bits. One or more embodiments can be implemented in tangible form in a program or programs defined by computer executable instructions that can be stored on a computer-readable medium. The computer-readable medium can be any of the devices, or a combination of the devices, described above in connection with the memory system 1006.

As described herein by the various embodiments, a system and method for detecting an incipient failure in a generator is possible by real time monitoring of magnetizing inductance, winding resistances, and the field to stator transformation ratio. Based on this PSO performance parameter estimation method within the current system and method, preventative maintenance measures can be taken into consideration before a forced outage of the generator is dictated. As described herein, the real time estimation of the generator performance parameters is preferred over the prior art since it does not require service interruption such as the partial load rejections required in the traditional approach.

When describing elements or features and/or embodiments thereof, the articles "a", "an", "the", and "said" are intended to mean that there are one or more of the elements or features. The terms "comprising", "including", and "having" are intended to be inclusive and mean that there may be additional elements or features beyond those specifically described.

Those skilled in the art will recognize that various changes can be made to the exemplary embodiments and implementations described above without departing from the scope of the disclosure. Accordingly, all matter contained in the above description or shown in the accompanying drawings should be interpreted as illustrative and not in a limiting sense.

It is further to be understood that the processes or steps described herein are not to be construed as necessarily requiring their performance in the particular order discussed or illustrated. It is also to be understood that additional or alternative processes or steps may be employed.

I claim:

1. A method of detecting an incipient failure of a generator in a power system comprising the steps of:
    ascertaining at least one generator reference parameter of the generator for use as a baseline reference;
    measuring at least one operating parameter value of the generator;
    using the at least one operating parameter value to solve for an estimated present value of at least one of the generator's current performance parameters using particle swarm optimization technique; and
    determining whether the estimated present values of the at least one of the generator's current performance parameters are outside of an acceptable limit.

2. The method of claim 1 wherein the step of determining whether the estimated present values of the at least one of the generator's current performance parameters are outside of an acceptable limit further comprises the step of ascertaining for each generator reference parameter a tolerance value from the corresponding generator reference parameter and determining whether the estimated present values of the generator current performance parameter is within a range between the reference value plus the tolerance value and the reference value minus the tolerance value.

3. The method of claim 1 wherein the step of determining whether the estimated present values of the at least one of the generator's current performance parameters are outside of an acceptable limit comprises the steps of:
    comparing the estimated value of at least one of the generator's current performance parameters to a corresponding one of the generator reference parameters; and
    if the estimated value is not an acceptable value, providing an alarm that an estimated value of at least one of the generator's current performance parameters is unacceptable.

4. The method of claim 1 wherein if during the step of determining whether the estimated present values of the at least one of the generator's current performance parameters are outside of an acceptable limit it is determined that the estimated present values of all of the generator's current performance parameters are within an acceptable limit, performing the step waiting a predetermined time and repeating the steps of claim 1.

5. The method of claim 1 wherein the step of using the at least one operating parameter value to solve for an estimated present value of the at least one of the generator's current performance parameters using particle swarm optimization technique further comprises the steps of:
    treating each estimated value of the at least one of the generator's current performance parameters set as a particle, wherein each set of estimated values is a different position of the particle; and
    for each new set of operating parameters:
        a. initializing each particle position,
        b. determining an initial value for the dynamic direct and quadrature generator voltage;

c. calculating a response of the generator model with a selected particle position using received operating field voltage,
d. determining a fitness evaluation of the particle to find a self best value and a global best value, and
e. updating a position and a velocity for each particle based on the determined self best value and global best value.

6. The method of claim 1 wherein the step of using the at least one operating parameter value to solve for an estimated present value of at least one of the generator's current performance parameters using particle swarm optimization technique further comprises the steps of:

treating each estimated value of the at least one of the generator's current performance parameters set as a particle, wherein each set of estimated values is a different position of the particle; and for each new set of operating parameters:

Step 0: initializing iteration indices, NOI=0, J=0
Step 1: initializing each particle position according to the equation:

$\hat{X} = \text{rand}( ) \cdot X_{nominal}$

Step 2: calculating initial values for the dynamic equations, $E'_d(0)$ and $E'_q(0)$, for the simulation models using the equations:

$$E'_d(0) = \frac{1}{N}\sum_{k=1}^{N} e_d(k) + R_a i_d(k) - \hat{X}_q i_q(k)$$

$$E'_q(0) = \frac{1}{N}\sum_{k=1}^{N} e_q(k) + R_a i_q(k) + \hat{X}_d i_d(k)$$

Step 3: calculating the model's response with a selected particle position, $e_d(k)$ and $e_q(k)$, k=1, ..., N, by applying the measured field voltages to the equations:

$$E'_d(k+1) = E'_d(k) + \frac{\Delta t}{\hat{T}'_{qo}}\left(-E'_d(k) + i_q(k)\left(\hat{X}_q - \hat{X}'_q\right)\right)$$

$$E'_q(k+1) = E'_q(k) + \frac{\Delta t}{\hat{T}'_{do}}\left(-E'_q(k) - i_d(k)\left(\hat{X}_d - \hat{X}'_d\right) + \hat{K}_{sd}E_{fd}(k)\right)$$

$$e_d(k) = E'_d(k) - \hat{R}_a i_d(k) + \hat{X}_q i_q(k)$$

$$e_q(k) = E'_q(k) - \hat{R}_a i_q(k) - \hat{X}_d i_d(k)$$

Step 4: calculating the fitness function:

$$J = \sum_{k=1}^{N}[(e_{d\_m}(k) - e_d(k))^2 + (e_{q\_m}(k) - e_q(k))^2]$$

to check the best particle based on the model's responses obtained in step 3 and the recorded responses and if it is better, update the best particle;
Step 5: until all particles are calculated, incrementing a particle counter and repeating steps 2, 3, and 4 above for each particle;
Step 6: updating new particle position and velocity using equations:

$v_{k+1} = \alpha v_k + \beta_1 \text{rand}_1(x_k^{self} - x_k) + \beta_2 \text{rand}_2(x_k^{global} - x_k)$ $x_{k+1} = x_k + v_k$ Step 7: determining whether the maximum number of iterations has been reached and if the maximum number of iterations has not been reached incrementing iteration counters (NOI and J) and proceed to step 8 and if reached, stopping further estimation of the parameter value;
Step 8: if the index J is 50, proceeding to step 1, and if index J is less than 50 proceeding to step 0.

7. The method of claim 1 wherein the generator reference parameters comprise at least one of: generator rated voltage and power output, $R_a$=armature winding resistance, $R_{fd}$=field winding resistance, $X_l$=leakage reactance, $X_d$=synchronous steady state direct reactance, $X_q$=synchronous steady state quadrature reactance, $X'_d$=synchronous dynamic direct reactance, $X'_q$=synchronous dynamic quadrature reactance, $T'_{do}$=generator open circuit direct time constant or $T'_{qo}$=generator open circuit quadrature time constant.

8. The method of claim 1 wherein the generator operating parameters comprise at least one of: $E_{fd}$=field voltage, $I_{fd}$=field current, $E_t$=terminal voltage, $I_t$=terminal current, $\phi$=the load angle, $\delta_i$=the power angle (internal rotor angle), $V_{gen}$=generator voltage, $V_r$=reference voltage, P=Real power of the generator, or Q=Reactive power of the generator.

9. The method of claim 1 wherein the generator's current performance parameters comprise at least one of: $X_d$=synchronous steady state direct reactance, $X_q$=synchronous steady state quadrature reactance, $X'_d$=synchronous dynamic direct reactance, $X'_q$=synchronous dynamic quadrature reactance, $T'_{do}$=generator open circuit direct time constant, or $T'_{qo}$=generator open circuit quadrature time constant.

10. A system for detecting an incipient failure of a generator in a power system comprising:
a processor operatively coupled to memory, an input data interface for receiving operating parameters associated with the generator and a user interface, the processor for executing computer executable instructions, the computer executable instructions structured to:
ascertain at least one generator reference parameter of the generator for use as a baseline reference;
measure at least one operating parameter value of the generator;
use the at least one operating parameter value to solve for an estimated present value of the at least one of the generator's current performance parameters using particle swarm optimization technique; and
determine whether the estimated present values of the at least one of the generator's current performance parameters are outside of an acceptable limit.

11. The system of claim 10 wherein the computer executable instructions structured to determine whether the estimated present values of the at least one of the generator's current performance parameters are outside of an acceptable limit are further structured to ascertain for each generator reference parameter a tolerance value from the corresponding generator reference parameter and determining whether the estimated present values of the generator current performance parameters is within a range between the reference value plus the tolerance value and the reference value minus the tolerance value.

12. The system of claim 10 wherein the computer executable instructions structured to determine whether the estimated present values of the at least one of the generator's current performance parameters are outside of an acceptable limit are further structured to:

compare the estimated value of at least one of the generator's current performance parameters to a corresponding one of the generator reference parameters; and if the estimated value is not an acceptable value, provide an alarm that an estimated value of at least one of the generator's current performance parameters is unacceptable.

13. The system of claim 10 wherein the computer executable instructions structured to use the at least one operating parameter value to solve for an estimated present value of the at least one of the generator's current performance parameter using particle swarm optimization technique are further structured to:

treat each estimated value of the at least one of the generator's current performance parameters set as a particle, wherein each set of estimated values is a different position of the particle; and for each new set of operating parameters, the computer executable instructions being further structured to:
 a. initialize each particle position,
 b. determine an initial value for the dynamic direct and quadrature generator voltage;
 c. calculate a response of the generator model with a selected particle position using received operating field voltage,
 d. determine a fitness evaluation of the particle to find a self best value and a global best value, and
 e. update a position and a velocity for each particle based on the determined self best value and global best value.

14. The system of claim 10 wherein the computer executable instructions structured to use the at least one operating parameter value to solve for an estimated present value of the at least one of the generator's current performance parameter using particle swarm optimization technique is further structured to:

treat each estimated value of the at least one of the generator's current performance parameters set as a particle, wherein each set of estimated values is a different position of the particle; and for each new set of operating parameters, the computer executable instructions being further structured to:
 a. initialize iteration indices, NOI=0, J=0
 b. initialize each particle position according to the equation:

$$\hat{X} = \text{rand}(\ ) \cdot X_{nominal}$$

c. calculate initial values for the dynamic equations, $E'_d(0)$ and $E'_q(0)$, for the simulation models using the equations:

$$E'_d(0) = \frac{1}{N}\sum_{k=1}^{N} e_d(k) + R_a i_d(k) - \hat{X}_q i_q(k)$$

$$E'_q(0) = \frac{1}{N}\sum_{k=1}^{N} e_q(k) + R_a i_q(k) + \hat{X}_d i_d(k)$$

d. calculate model's response with a selected particle position, $e_d(k)$ and $e_q(k)$, k=1, ..., N, by applying the measured field voltages to the equations:

$$E'_d(k+1) = E'_d(k) + \frac{\Delta t}{\hat{T}'_{qo}}\left(-E'_d(k) + i_q(k)(\hat{X}_q - \hat{X}'_q)\right)$$

$$E'_q(k+1) = E'_q(k) + \frac{\Delta t}{\hat{T}'_{do}}\left(-E'_q(k) - i_d(k)(\hat{X}_d - \hat{X}'_d) + \hat{K}_{sd}E_{fd}(k)\right)$$

$$e_d(k) = E'_d(k) - \hat{R}_a i_d(k) + \hat{X}_q i_q(k)$$

$$e_q(k) = E'_q(k) - \hat{R}_a i_q(k) - \hat{X}_d i_d(k)$$

e. calculate the fitness function:

$$J = \sum_{k=1}^{N} [(e_{d\_m}(k) - e_d(k))^2 + (e_{q\_m}(k) - e_q(k))^2]$$

to check the best particle based on the model's responses obtained in (d.) and the recorded responses and if it is better, update the best particle;
 f. until all particles are calculated, increment a particle counter and utilize the structure of (c.), (d.) and (e.) above for each particle; and
 g. update new particle position and velocity using equations:

$$v_{k+1} = \alpha v_k + \beta_1 \text{rand}_1(x_k^{self} - x_k) + \beta_2 \text{rand}_2(x_k^{global} - x_k)$$

$$x_{k+1} = x_k + v_k$$

h. determine whether the maximum number of iterations has been reached and if reached, stop further estimation of the parameter value.

15. The system of claim 10 wherein the generator reference parameters comprise at least one of: generator rated voltage and power output, $R_a$=armature winding resistance, $R_{fd}$=field winding resistance, $X_l$=leakage reactance, $X_d$=synchronous steady state direct reactance, $X_q$=synchronous steady state quadrature reactance, $X'_d$=synchronous dynamic direct reactance, $X'_q$=synchronous dynamic quadrature reactance, $T'_{do}$=generator open circuit direct time constant or $T'_{qo}$=generator open circuit quadrature time constant.

16. The system of claim 10 wherein the generator operating parameters comprise at least one of: $E_{fd}$=field voltage, $I_{fd}$=field current, $E_t$=terminal voltage, $I_t$=terminal current, $\phi$=the load angle, $\delta_i$=the power angle (internal rotor angle), $V_{gen}$=generator voltage, $V_r$=reference voltage, P=Real power of the generator, or Q=Reactive power of the generator.

17. The system of claim 10 wherein the generator's current performance parameters comprise at least one of: $X_d$=synchronous steady state direct reactance, $X_q$=synchronous steady state quadrature reactance, $X'_d$=synchronous dynamic direct reactance, $X'_q$=synchronous dynamic quadrature reactance, $T'_{do}$=generator open circuit direct time constant, or $T'_{qo}$=generator open circuit quadrature time constant.

18. A system for detecting an incipient failure of a generator in a power system comprising software code having a plurality of computer executable instructions comprising instructions structured to:
 ascertain at least one generator reference parameter of the generator for use as a baseline reference;
 measure at least one operating parameter value of the generator;
 use the at least one operating parameter value to solve for an estimated present value of the at least one of the generator's current performance parameters using particle swarm optimization technique; and determine whether the estimated present values of the at least one of the generator's current performance parameters are outside of an acceptable limit.

19. The system of claim 18 wherein the computer executable instructions structured to determine whether the estimated present values of the at least one of the generator's current performance parameters are outside of an acceptable limit are further structured to ascertain for each generator reference parameter a tolerance value from the corresponding generator reference parameter and determining whether the estimated present values of the generator current performance parameter is within a range between the reference value plus the tolerance value and the reference value minus the tolerance value.

20. The system of claim 18 wherein the computer executable instructions structured to determine whether the estimated present values of the at least one of the generator's current performance parameters are outside of an acceptable limit are further structured to:

compare the estimated value of at least one of the generator's current performance parameters to a corresponding one of the generator reference parameters; and if the estimated value is not an acceptable value, provide an alarm that an estimated value of at least one of the generator's current performance parameters is unacceptable.

21. The system of claim 18 wherein the computer executable instructions structured to use the at least one operating parameter value to solve for an estimated present value of the at least one of the generator's current performance parameters using particle swarm optimization technique are further structured to:

treat each estimated value of the at least one of the generator's current performance parameters set as a particle, wherein each set of estimated values is a different position of the particle; and for each new set of operating parameters:
a. initialize each particle position,
b. determine an initial value for the dynamic direct and quadrature generator voltage;
c. calculate a response of the generator model with a selected particle position using received operating field voltage,
d. determine a fitness evaluation of the particle to find a self best value and a global best value, and
e. update a position and a velocity for each particle based on the determined self best value and global best value.

22. The system of claim 18 wherein the computer executable instructions structured to use the at least one operating parameter value to solve for an estimated present value of the at least one of the generator's current performance parameters using particle swarm optimization technique are further structured to:

treat each estimated value of the at least one of the generator's current performance parameters set as a particle, wherein each set of estimated values is a different position of the particle; and for each new set of operating parameters:
a. initialize iteration indices, NOI=0, J=0
b. initialize each particle position according to the equation:

$$\hat{X} = \text{rand}() \cdot X_{nominal}$$

c. calculate initial values for the dynamic equations, $E'_d(0)$ and $E'_q(0)$, for the simulation models using the equations:

$$E'_d(0) = \frac{1}{N}\sum_{k=1}^{N} e_d(k) + R_a i_d(k) - \hat{X}_q i_q(k)$$

$$E'_q(0) = \frac{1}{N}\sum_{k=1}^{N} e_q(k) + R_a i_q(k) + \hat{X}_d i_d(k)$$

d. calculate model's response with a selected particle position, $e_d(k)$ and $e_q(k)$, k=1, ..., N, by applying the measured field voltages to the equations:

$$E'_d(k+1) = E'_d(k) + \frac{\Delta t}{\hat{T}'_{qo}}\left(-E'_d(k) + i_q(k)\left(\hat{X}_q - \hat{X}'_q\right)\right)$$

$$E'_q(k+1) = E'_q(k) + \frac{\Delta t}{\hat{T}'_{do}}\left(-E'_q(k) - i_d(k)\left(\hat{X}_d - \hat{X}'_d\right) + \hat{K}_{sd}E_{fd}(k)\right)$$

$$e_d(k) = E'_d(k) - \hat{R}_a i_d(k) + \hat{X}_q i_q(k)$$

$$e_q(k) = E'_q(k) - \hat{R}_a i_q(k) - \hat{X}_d i_d(k)$$

e. calculate the fitness function:

$$J = \sum_{k=1}^{N} [(e_{d\_m}(k) - e_d(k))^2 + (e_{q\_m}(k) - e_q(k))^2]$$

to check the best particle based on the model's responses obtained in (d.) and the recorded responses and if it is better, update the best particle;

f. until all particles are calculated, increment a particle counter and utilize the structure of (c.), (d.) and (e.) above for each particle;

g. update new particle position and velocity using equations:

$$v_{k+1} = \alpha v_k + \beta_1 \text{rand}_1(x_k^{self} - x_k) + \beta_2 \text{rand}_2(x_k^{global} - x_k)$$

$$x_{k+1} = x_k + v_k$$

h. determine whether the maximum number of iterations has been reached and if reached, stop further estimation of the parameter value.

23. The system of claim 18 wherein the generator reference parameters comprise at least one of: generator rated voltage and power output, $R_a$=armature winding resistance, $R_{fd}$=field winding resistance, $X_l$=leakage reactance, $X_d$=synchronous steady state direct reactance, $X_q$=synchronous steady state quadrature reactance, $X'_d$=synchronous dynamic direct reactance, $X'_q$=synchronous dynamic quadrature reactance, $T'_{do}$=generator open circuit direct time constant or $T'_{qo}$=generator open circuit quadrature time constant.

24. The system of claim 18 wherein the generator operating parameters comprise at least one of: $E_{fd}$=field voltage, $I_{fd}$=field current, $E_t$=terminal voltage, $I_t$=terminal current, $\phi$=the load angle, $\delta_i$=the power angle (internal rotor angle), $V_{gen}$=generator voltage, $V_r$=reference voltage, P=Real power of the generator, or Q=Reactive power of the generator.

25. The system of claim 18 wherein the generator's current performance parameters comprise at least one of: $X_d$=synchronous steady state direct reactance, $X_q$=synchronous steady state quadrature reactance, $X'_d$=synchronous dynamic direct reactance, $X'_q$=synchronous dynamic quadrature reactance, $T'_{do}$=generator open circuit direct time constant, or $T'_{qo}$=generator open circuit quadrature time constant.

* * * * *